(12) United States Patent
Yuan

(10) Patent No.: US 9,263,539 B2
(45) Date of Patent: Feb. 16, 2016

(54) THIN-FILM TRANSISTOR AND FABRICATION METHOD THEREOF, ARRAY SUBSTRATE AND DISPLAY DEVICE

(71) Applicant: BOE TECHNOLOGY GROUP CO., LTD., Beijing (CN)

(72) Inventor: Guangcai Yuan, Beijing (CN)

(73) Assignee: BOE TECHNOLOGY GROUP CO., LTD, Beijing (CN)

( * ) Notice: Subject to any disclaimer, the term of this patent is extended or adjusted under 35 U.S.C. 154(b) by 0 days.

(21) Appl. No.: 14/349,120

(22) PCT Filed: Jun. 18, 2013

(86) PCT No.: PCT/CN2013/077417
§ 371 (c)(1),
(2) Date: Apr. 2, 2014

(87) PCT Pub. No.: WO2014/166160
PCT Pub. Date: Oct. 16, 2014

(65) Prior Publication Data
US 2015/0194498 A1    Jul. 9, 2015

(30) Foreign Application Priority Data

Apr. 10, 2013  (CN) .......................... 2013 1 0123609

(51) Int. Cl.
*H01L 29/49* (2006.01)
*H01L 29/423* (2006.01)
*H01L 29/45* (2006.01)
*H01L 29/786* (2006.01)

(52) U.S. Cl.
CPC ...... *H01L 29/4908* (2013.01); *H01L 29/42384* (2013.01); *H01L 29/45* (2013.01); *H01L 29/456* (2013.01); *H01L 29/495* (2013.01); *H01L 29/7869* (2013.01); *H01L 29/78606* (2013.01); *H01L 29/78663* (2013.01); *H01L 29/78672* (2013.01)

(58) Field of Classification Search
CPC ....................................................... H01L 27/32
See application file for complete search history.

(56) References Cited

U.S. PATENT DOCUMENTS 7,851,920 B2    12/2010  Lee et al.
2012/0217500 A1  8/2012  Park et al.

FOREIGN PATENT DOCUMENTS

| CN | 1897270 A | 1/2007 |
| CN | 101179029 A | 5/2008 |
| CN | 102651402 A | 8/2012 |

OTHER PUBLICATIONS

English Translation of CN1897270 A of record.*

(Continued)

*Primary Examiner* — Mamadou Diallo
(74) *Attorney, Agent, or Firm* — Collard & Roe, P.C.

(57) ABSTRACT

Embodiments of the invention provide a thin-film transistor and a fabrication method thereof, an array substrate and a display device. The thin-film transistor comprises a gate electrode (2), an active layer (4), source and drain electrodes (6), and a gate insulating layer (3) provided between the gate electrode (2) and the active layer (4). The gate electrode (2) comprises a gate electrode metal layer (23) and a first protection layer (32), the first protection layer (32) is provided between the gate electrode metal layer (23) and the gate insulating layer (3) to isolate the active layer (4) from the gate electrode metal layer (23). The gate electrode metal layer (23) is made of copper or copper alloy.

17 Claims, 1 Drawing Sheet

(56) References Cited

OTHER PUBLICATIONS

International Search Report, International Preliminary Report on Patentability and Written Opinion of the International Searching Authority of PCT/CN2013/077417 in Chinese, mailed Jan. 16, 2014.
Chinese Office Action of Chinese Application No. 201310123609.3, mailed Feb. 27, 2015 with English translation.
English Translation of the International Search Report of PCT/CN2013/077417 published in English on Oct. 16, 2014.
International Search Report of PCT/CN2013/077417 in English, mailed Jan. 16, 2014.
Second Chinese Office Action dated Nov. 2, 2015 in CN 201310123609.3.
English translation of the International Preliminary Report on Patentability and Written Opinion of the International Searching Authority of PCT/CN2013/077417, issued Oct. 13, 2015.

\* cited by examiner

THIN-FILM TRANSISTOR AND FABRICATION METHOD THEREOF, ARRAY SUBSTRATE AND DISPLAY DEVICE

CROSS REFERENCE TO RELATED APPLICATIONS

This application is the National Stage of PCT/CN2013/077417 filed on Jun. 18, 2013, which claims priority under 35 U.S.C. §119 of Chinese Application No. 201310123609.3 filed on Apr. 10, 2013, the disclosure of which is incorporated by reference. The international application under PCT article 21(2) was not published in English.

TECHNICAL FIELD

Embodiments of the invention relate to a thin-film transistor and a fabrication method thereof, an array substrate and a display device.

BACKGROUND

Among flat panel display devices, Thin-film Transistor Liquid Crystal Display (TFT-LCD) has a dominant role due to its advantages of small size, low power consumption, low fabrication cost, low radiation and the like.

Oxide Thin-film Transistor (OTFT) has the advantages of ultra thin thickness, light weight, low power consumption and the like, and thus the OTFT not only can be applied to the liquid crystal display panel, but also provides a possibility of applying organic light emitting display panel as a new generation of display panel in the future.

The conventional fabrication process of an array substrate is as follows: forming a gate electrode on a base substrate, depositing a gate insulating layer, depositing an active layer, forming source and drain electrodes, depositing a passivation layer and forming a pixel electrode.

However, the conventional fabrication process as described above has the following drawbacks. Copper (Cu) or Cu alloy is used to form the gate electrode and the source and drain electrodes, and in this case, Cu may diffuse into the active layer due to its relatively active property. Therefore, Cu is apt to contaminate the active layer, so that the carrier mobility may be reduced and defects may occur in the resultant product.

SUMMARY OF THE INVENTION

According to one aspect of the invention, there is provided a thin-film transistor. The thin-film transistor comprises a gate electrode, an active layer, source and drain electrodes, and a gate insulating layer provided between the gate electrode and the active layer. The gate electrode comprises a gate electrode metal layer and a first protection layer, the first protection layer is provided between the gate electrode metal layer and the gate insulating layer to isolate the active layer from the gate electrode metal layer. The gate electrode metal layer is made of copper or copper alloy.

For example, the gate electrode further comprises a second protection layer, and the second protection layer is provided on an side of the gate electrode metal layer opposite to the first protection layer; and the second protection layer comprises a first gate protection layer and a second gate protection layer, the second gate protection layer is provided between the first gate protection layer and the gate electrode metal layer.

For example, the first gate protection layer is made of silicon nitride or titanium nitride; and/or the second gate protection layer is made of molybdenum titanium alloy, molybdenum tungsten alloy, molybdenum zirconium alloy, molybdenum niobium alloy, molybdenum copper alloy, molybdenum vanadium alloy, molybdenum tantalum alloy, molybdenum nickel alloy, molybdenum chromium alloy, molybdenum hafnium alloy, molybdenum rhodium alloy, molybdenum cobalt alloy, molybdenum palladium alloy, molybdenum platinum alloy, molybdenum aluminum alloy, molybdenum manganese alloy, titanium silicide, tungsten silicide, zirconium silicide, niobium silicide, copper silicide, vanadium silicide, tantalum silicide, nickel silicide, chromium silicide, hafnium silicide, rhodium silicide, cobalt silicide, palladium silicide, platinum silicide, aluminum silicide or manganese silicide.

For example, the first protection layer comprises a third gate protection layer and a fourth gate protection layer, the third gate protection layer is provided between the gate electrode metal layer and the fourth gate protection layer.

For example, the third gate protection layer is made of molybdenum aluminum niobium alloy, molybdenum tungsten alloy, molybdenum zirconium alloy, molybdenum vanadium alloy, molybdenum tantalum alloy, molybdenum nickel alloy, molybdenum chromium alloy, molybdenum cobalt alloy, molybdenum palladium alloy, molybdenum platinum alloy, molybdenum hafnium alloy, molybdenum rhodium alloy, molybdenum manganese alloy, molybdenum silicide or molybdenum titanium alloy; and/or the fourth gate protection layer is made of molybdenum nitride, molybdenum silicide nitride, aluminum molybdenum nitride, copper molybdenum nitride, tungsten molybdenum nitride, zirconium molybdenum nitride, hafnium molybdenum nitride, rhodium molybdenum nitride, vanadium molybdenum nitride, tantalum molybdenum nitride, nickel molybdenum nitride, chromium molybdenum nitride, cobalt molybdenum nitride, palladium molybdenum nitride, platinum molybdenum nitride, manganese molybdenum nitride, titanium molybdenum nitride, molybdenum silicide chloride, aluminum molybdenum chloride, copper molybdenum chloride, tungsten molybdenum chloride, zirconium molybdenum chloride, hafnium molybdenum chloride, rhodium molybdenum chloride, vanadium molybdenum chloride, tantalum molybdenum chloride, nickel molybdenum chloride, chromium molybdenum chloride, cobalt molybdenum chloride, palladium molybdenum chloride, platinum molybdenum chloride, manganese molybdenum chloride, titanium molybdenum chloride, molybdenum silicide phosphide, aluminum molybdenum phosphide, copper molybdenum phosphide, tungsten molybdenum phosphide, zirconium molybdenum phosphide, hafnium molybdenum phosphide, rhodium molybdenum phosphide, vanadium molybdenum phosphide, tantalum molybdenum phosphide, nickel molybdenum phosphide, chromium molybdenum phosphide, cobalt molybdenum phosphide, palladium molybdenum phosphide, platinum molybdenum phosphide, manganese molybdenum phosphide or titanium molybdenum phosphide.

For example, the source and drain electrodes of the thin-film transistor comprises a source and drain electrodes metal layer and a second source/drain protection layer, the second source/drain protection layer is provided between the source and drain electrodes metal layer and the active layer to isolate the source and drain electrodes metal layer from the active layer; and the source and drain electrodes metal layer is made of copper or copper alloy.

For example, the second source/drain protection layer is made of molybdenum titanium alloy, molybdenum tungsten alloy, molybdenum zirconium alloy, molybdenum niobium alloy, molybdenum copper alloy, molybdenum vanadium alloy, molybdenum tantalum alloy, molybdenum nickel alloy, molybdenum chromium alloy, molybdenum hafnium alloy, molybdenum rhodium alloy, molybdenum cobalt alloy, molybdenum palladium alloy, molybdenum platinum alloy, molybdenum aluminum alloy, molybdenum manganese alloy, titanium silicide, tungsten silicide, zirconium silicide, niobium silicide, copper silicide, vanadium silicide, tantalum silicide, nickel silicide, chromium silicide, hafnium silicide, rhodium silicide, cobalt silicide, palladium silicide, platinum silicide, aluminum silicide or manganese silicide.

For example, the source and drain electrodes further comprises a third protection layer, the third protection layer is provided on an side of the source/drain metal layer opposite to the second source/drain protection layer; and the third protection layer comprises a third source/drain protection layer and a fourth source/drain protection layer, and the third source/drain protection layer is provided between the source and drain electrodes metal layer and the fourth source/drain protection layer.

For example, the third source/drain protection layer is made of molybdenum aluminum niobium alloy, molybdenum tungsten alloy, molybdenum zirconium alloy, molybdenum vanadium alloy, molybdenum tantalum alloy, molybdenum nickel alloy, molybdenum chromium alloy, molybdenum cobalt alloy, molybdenum palladium alloy, molybdenum platinum alloy, molybdenum hafnium alloy, molybdenum rhodium alloy, molybdenum manganese alloy, molybdenum silicide or molybdenum titanium alloy; and/or the fourth source/drain protection layer is made of molybdenum nitride, molybdenum silicide nitride, aluminum molybdenum nitride, copper molybdenum nitride, tungsten molybdenum nitride, zirconium molybdenum nitride, hafnium molybdenum nitride, rhodium molybdenum nitride, vanadium molybdenum nitride, tantalum molybdenum nitride, nickel molybdenum nitride, chromium molybdenum nitride, cobalt molybdenum nitride, palladium molybdenum nitride, platinum molybdenum nitride, manganese molybdenum nitride, titanium molybdenum nitride, molybdenum silicide chloride, aluminum molybdenum chloride, copper molybdenum chloride, tungsten molybdenum chloride, zirconium molybdenum chloride, hafnium molybdenum chloride, rhodium molybdenum chloride, vanadium molybdenum chloride, tantalum molybdenum chloride, nickel molybdenum chloride, chromium molybdenum chloride, cobalt molybdenum chloride, palladium molybdenum chloride, platinum molybdenum chloride, manganese molybdenum chloride, titanium molybdenum chloride, molybdenum silicide phosphide, aluminum molybdenum phosphide, copper molybdenum phosphide, tungsten molybdenum phosphide, zirconium molybdenum phosphide, hafnium molybdenum phosphide, rhodium molybdenum phosphide, vanadium molybdenum phosphide, tantalum molybdenum phosphide, nickel molybdenum phosphide, chromium molybdenum phosphide, cobalt molybdenum phosphide, palladium molybdenum phosphide, platinum molybdenum phosphide, manganese molybdenum phosphide or titanium molybdenum phosphide.

For example, the thin-film transistor is a bottom-gate-type thin-film transistor or a top-gate-type thin-film transistor.

For example, the active layer is made of metal oxide semiconductor, polysilicon or amorphous silicon.

According to another aspect of the invention, there is provided an array substrate. The array substrate comprises the above-mentioned thin-film transistor.

According to another aspect of the invention, there is provided a display device. The display device comprises the above-mentioned array substrate.

According to another aspect of the invention, there is provided a method for fabricating a thin-film transistor. The method comprises: forming a gate electrode on a base substrate, wherein the gate electrode comprises a gate electrode metal layer and a first protection layer sequentially formed on the base substrate, and the gate electrode metal layer is made of copper or copper alloy; forming a gate insulating layer to cover the gate electrode and the base substrate on the base substrate on which the gate electrode has been formed; forming an active layer provided above the gate electrode on the base substrate on which the gate insulating layer has been formed, and forming an etching barrier layer on the active layer; and forming source and drain electrodes on the base substrate on which the etching barrier layer has been formed.

For example, the gate electrode comprises a second protection layer, the gate electrode metal layer and the first protection layer sequentially formed on the base substrate.

For example, the second protection layer comprises a first gate protection layer and a second gate protection layer sequentially formed on the base substrate; the first protection layer comprises a third gate protection layer and a fourth gate protection layer sequentially formed on the gate electrode metal layer.

For example, the source and drain electrodes comprise a second source/drain protection layer and a source and drain electrodes metal layer sequentially formed on the etching barrier layer.

For example, the source and drain electrodes further comprises a third protection layer formed on the source and drain electrodes metal layer, and the third protection layer comprises a third source/drain protection layer and a fourth source/drain protection layer sequentially formed on the source and drain electrodes metal layer.

According to still another aspect of the invention, there is provided another method for fabricating a thin-film transistor. The method comprises: forming source and drain electrodes on a base substrate; forming an etching barrier layer on the base substrate on which the source and drain electrodes has been formed; forming an active layer provided above the source and drain electrodes on the base substrate on which the etching barrier layer has been formed; forming a gate insulating layer on the base substrate on which the active layer has been formed; and forming a gate electrode on the substrate on which the gate insulating layer has been formed, wherein the gate electrode comprises a first protection layer and a gate electrode metal layer sequentially formed on the gate insulating layer, and the gate electrode metal layer is made of copper or copper alloy.

For example, the gate electrode comprises the first protection layer, the gate electrode metal layer and a second protection layer sequentially formed on the gate insulating layer.

For example, the first protection layer comprises a fourth gate protection layer and a third gate protection layer sequentially formed on the gate insulating layer; and the second protection layer comprises a second gate protection layer and a first gate protection layer sequentially formed on the gate electrode metal layer.

For example, the source and drain electrodes comprise a source and drain electrodes metal layer and a second source/drain protection layer sequentially formed on the base substrate.

For example, the source and drain electrodes comprises a third protection layer, a source and drain electrodes metal layer and a second source/drain protection layer sequentially formed on the base substrate, and the third protection layer comprises a fourth source/drain protection layer and a third source/drain protection layer sequentially formed on the base substrate.

For example, after forming the gate insulating layer, an annealing process is performed on the gate insulating layer.

According to the embodiments of the invention, the first protection layer is used to isolate copper or copper alloy of the gate electrode metal layer from the active layer, and thereby contamination of the active layer caused by copper diffusion can be prevented and the yield can be greatly improved.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DESCRIPTION OF THE EMBODIMENTS

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

The embodiments of the invention provide a thin-film transistor and a fabrication method thereof, an array substrate and a display device. In the embodiments of the invention, a first protection layer is used to isolate a gate electrode metal layer from an active layer, and thereby change of the carrier mobility caused by the diffusion of Cu into the active layer can be avoided and the yield can be improved.

The array substrate according to the embodiment of the invention comprises a plurality of gate lines and a plurality of data lines, the gate lines and the data lines intersect with each other to form a plurality of pixel units arranged in a matrix form, and each pixel unit comprises a thin-film transistor and a pixel electrode. The following description is mainly made with respect to a single pixel unit, but other pixel units may be formed similarly.

Figure 1:
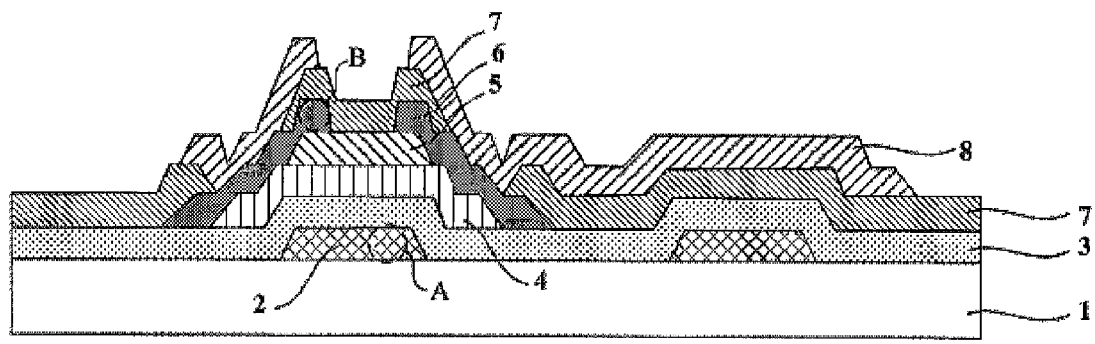
FIG. 1 is a structural schematic view illustrating an array substrate comprising a thin-film transistor according to an embodiment of the invention.
Figure 2:
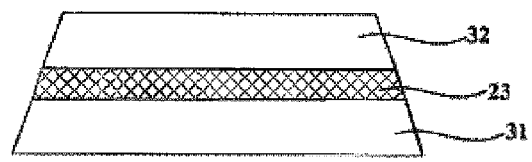
FIG. 2 is a partially enlarged view illustrating a region A of a gate electrode of the thin-film transistor illustrated in FIG. 1.

FIG. 1 is a structural schematic view illustrating an array substrate comprising a thin-film transistor according to an embodiment of the invention, and FIG. 2 is a partially enlarged view illustrating a region A of a gate electrode of the thin-film transistor illustrated in FIG. 1. The thin-film transistor shown in FIG. 1 is of a bottom gate type; however, it should be understood that the embodiment of the invention is also applicable to a top-gate-type thin-film transistor. As shown in FIG. 1, the thin-film transistor according to the embodiment of the invention comprises a gate electrode 2, an active layer 4, source and drain electrodes 6 and a gate insulating layer 3 provided between the gate electrode 2 and the active layer 4.

As shown in FIG. 2, the gate electrode 2 comprises a gate electrode metal layer 23 and a first protection layer 32, the first protection layer 32 is provided between the gate electrode metal layer 23 and the gate insulating layer 3 to isolate the active layer 4 from the gate electrode metal layer 23.

The gate electrode metal layer 23 is made of Cu or Cu alloy.

In the embodiment of the invention, as for either the top-gate-type thin-film transistor or the bottom-gate-type thin-film transistor, contamination of the active layer caused by the diffusion of Cu into the active layer can be avoided because the first protection layer isolates the active layer from the gate electrode metal layer, and thus the yield can be improved.

For example, as shown in FIG. 2, the gate electrode further comprises a second protection layer 31 on a side of the gate electrode metal layer 23 opposite to the first protection layer 32.

Figure 3:
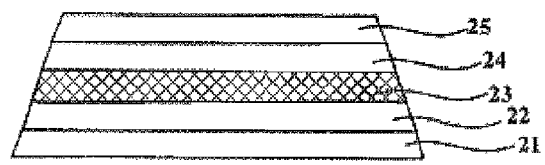
FIG. 3 is a structural schematic view illustrating the gate electrode of the thin-film transistor according to the embodiment of the invention.

As shown in FIG. 3, the second protection layer 31 comprises a first gate protection layer 21 and a second gate protection layer 22, and the second gate protection layer 22 is provided between the gate electrode metal layer 23 and the first gate protection layer 21.

For example, the first gate protection layer 21 is made of silicon nitride or titanium nitride.

For example, the second gate protection layer 22 is made of molybdenum titanium alloy, molybdenum tungsten alloy, molybdenum zirconium alloy, molybdenum niobium alloy, molybdenum copper alloy, molybdenum vanadium alloy, molybdenum tantalum alloy, molybdenum nickel alloy, molybdenum chromium alloy, molybdenum hafnium alloy, molybdenum rhodium alloy, molybdenum cobalt alloy, molybdenum palladium alloy, molybdenum platinum alloy, molybdenum aluminum alloy, molybdenum manganese alloy, titanium silicide, tungsten silicide, zirconium silicide, niobium silicide, copper silicide, vanadium silicide, tantalum silicide, nickel silicide, chromium silicide, hafnium silicide, rhodium silicide, cobalt silicide, palladium silicide, platinum silicide, aluminum silicide or manganese silicide.

In the embodiment of the invention, the first gate protection layer 21 can increase the adhesion between the gate electrode and a base substrate, and the second gate protection layer 22 can prevent the diffusion of Cu of the gate electrode metal layer. In the embodiment of the invention, the first gate protection layer 21 may either be a single layer structure or a multi-layer structure; the multi-layer structure is formed with a laminated structure of silicon nitride and titanium nitride. For example, the first gate protection layer 21 is obtained by forming the silicon nitride layer and the titanium nitride layer sequentially on the base substrate. The second gate protection layer 22 may be a single layer structure or a multi-layer structure; the multi-layer structure, such as a double-layer structure, a three-layer structure or a four-layer structure is formed with the above-mentioned materials for the second gate protection layer. The first gate protection layer 21 may be made of silicon nitride or titanium nitride, or other inorganic insulating materials with material properties identical with or similar to the above-mentioned materials for forming the first gate protection layer. The thickness of the first gate protection layer 21 may be 10 nm-300 nm. The second gate protection layer 22 is mainly made of alloy of molybdenum (Mo), titanium (Ti) and silicon (Si), wherein the element Ti may be replaced by tungsten (W), zirconium (Zr), niobium (Nb), copper (Cu), vanadium (V), tantalum (Ta), nickel (Ni), chromium (Cr), hafnium (Hf), rhodium (Rh), cobalt (Co), palladium (Pd), platinum (Pt), aluminum (Al) or manganese (Mn). In addition, the second gate protection layer 22 may be made of other materials with material properties identical with or similar to the above-mentioned materials for forming the second gate protection layer 22.

For example, as shown in FIG. 3, the first protection layer 32 comprises a third gate protection layer 24 and a fourth gate protection layer 25, and the third gate protection layer 24 is provided between the gate electrode metal layer 23 and the fourth gate protection layer 25.

For example, the third gate protection layer 24 is made of molybdenum aluminum niobium alloy, molybdenum tungsten alloy, molybdenum zirconium alloy, molybdenum vanadium alloy, molybdenum tantalum alloy, molybdenum nickel alloy, molybdenum chromium alloy, molybdenum cobalt alloy, molybdenum palladium alloy, molybdenum platinum alloy, molybdenum hafnium alloy, molybdenum rhodium alloy, molybdenum manganese alloy, molybdenum silicide or molybdenum titanium alloy.

For example, the fourth protection layer 25 is made of molybdenum nitride, molybdenum silicide nitride, aluminum molybdenum nitride, copper molybdenum nitride, tungsten molybdenum nitride, zirconium molybdenum nitride, hafnium molybdenum nitride, rhodium molybdenum nitride, vanadium molybdenum nitride, tantalum molybdenum nitride, nickel molybdenum nitride, chromium molybdenum nitride, cobalt molybdenum nitride, palladium molybdenum nitride, platinum molybdenum nitride, manganese molybdenum nitride, titanium molybdenum nitride, molybdenum silicide chloride, aluminum molybdenum chloride, copper molybdenum chloride, tungsten molybdenum chloride, zirconium molybdenum chloride, hafnium molybdenum chloride, rhodium molybdenum chloride, vanadium molybdenum chloride, tantalum molybdenum chloride, nickel molybdenum chloride, chromium molybdenum chloride, cobalt molybdenum chloride, palladium molybdenum chloride, platinum molybdenum chloride, manganese molybdenum chloride, titanium molybdenum chloride, molybdenum silicide phosphide, aluminum molybdenum phosphide, copper molybdenum phosphide, tungsten molybdenum phosphide, zirconium molybdenum phosphide, hafnium molybdenum phosphide, rhodium molybdenum phosphide, vanadium molybdenum phosphide, tantalum molybdenum phosphide, nickel molybdenum phosphide, chromium molybdenum phosphide, cobalt molybdenum phosphide, palladium molybdenum phosphide, platinum molybdenum phosphide, manganese molybdenum phosphide or titanium molybdenum phosphide.

In the embodiment of the invention, the first protection layer 32 is used for isolating the gate electrode metal layer from the active layer, and the first protection layer is formed with the double-layer structure of the third gate protection layer 24 and the fourth gate protection layer 25. The third gate protection layer 24 may be formed as a single layer structure formed by one of the above-mentioned materials for forming the third gate protection layer, or the third gate protection layer 24 may be formed as a laminated structure formed by two or more of above-mentioned materials. The fourth gate protection layer 25 may be formed as a single layer structure formed by one of the above-mentioned materials for forming the fourth gate protection layer, or the fourth gate protection layer 25 may be formed as a laminated structure formed by two or more of the above-mentioned materials. The third gate protection layer 24 is made of alloy of Mo, Al and Nb, wherein Al may be replaced by W, Zr, V, Ta, Ni, Cr, Co, Pd, Pt, Hf, Rh, Mn, Ti, Si or other elements, and Nb may be replaced by W, Zr, V, Ta, Ni, Cr, Co, Pd, Pt, Hf, Rh, Mn, Ti, Si or other elements.

Figure 4:
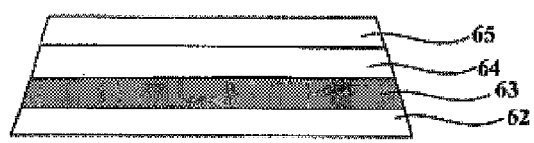
FIG. 4 is a partially enlarged view illustrating a region B of source and drain electrodes of the thin-film transistor illustrated in FIG. 1.

For example, as shown in FIG. 1 and FIG. 4, the source and drain electrodes 6 of the thin-film transistor comprises a source and drain electrodes metal layer 63 and a second source/drain protection layer 62. The second source/drain protection layer 62 is provided between the source and drain electrodes metal layer 63 and the active layer 4 to isolate the source and drain electrodes metal layer 63 from the active layer 4.

The source and drain electrodes metal layer 63 is made of Cu or Cu alloy.

Similar to the gate electrode, in the case that the source and drain electrodes are made of copper or copper alloy, the second source/drain protection layer is provided to isolate the source and drain electrodes metal layer from the active layer, so as to avoid change of the carrier mobility caused by the diffusion of Cu into the active layer. Thus, the yield can be improved.

For example, the second source/drain protection layer 62 is made of molybdenum titanium alloy, molybdenum tungsten alloy, molybdenum zirconium alloy, molybdenum niobium alloy, molybdenum copper alloy, molybdenum vanadium alloy, molybdenum tantalum alloy, molybdenum nickel alloy, molybdenum chromium alloy, molybdenum hafnium alloy, molybdenum rhodium alloy, molybdenum cobalt alloy, molybdenum palladium alloy, molybdenum platinum alloy, molybdenum aluminum alloy, molybdenum manganese alloy, titanium silicide, tungsten silicide, zirconium silicide, niobium silicide, copper silicide, vanadium silicide, tantalum silicide, nickel silicide, chromium silicide, hafnium silicide, rhodium silicide, cobalt silicide, palladium silicide, platinum silicide, aluminum silicide or manganese silicide.

The materials for forming the second source/drain protection layer 62 are same as the materials for forming the second gate protection layer 22. Similarly, the second source/drain protection layer 62 may be formed as a single layer structure formed by one of the above-mentioned materials, or the second source/drain protection layer 62 may be formed as a laminated structure formed by two or more of the above-mentioned materials.

For example, as shown in FIG. 4, the source and drain electrodes 6 further comprises a third protection layer, and the third protection layer is provided on a side of the source and drain electrodes metal layer 63 opposite to the second source/drain protection layer 62.

The third protection layer comprises a third source/drain protection layer 64 and a fourth source/drain protection layer 65, and the third source/drain protection layer 64 is provided between the source and drain electrodes metal layer 63 and the fourth source/drain protection layer 65.

For example, the third source/drain protection layer 64 is made of molybdenum aluminum niobium alloy, molybdenum tungsten alloy, molybdenum zirconium alloy, molybdenum vanadium alloy, molybdenum tantalum alloy, molybdenum nickel alloy, molybdenum chromium alloy, molybdenum cobalt alloy, molybdenum palladium alloy, molybdenum platinum alloy, molybdenum hafnium alloy, molybdenum rhodium alloy, molybdenum manganese alloy, molybdenum silicide or molybdenum titanium alloy.

For example, the fourth source/drain protection layer 65 is made of molybdenum nitride, molybdenum silicide nitride, aluminum molybdenum nitride, copper molybdenum nitride, tungsten molybdenum nitride, zirconium molybdenum nitride, hafnium molybdenum nitride, rhodium molybdenum nitride, vanadium molybdenum nitride, tantalum molybdenum nitride, nickel molybdenum nitride, chromium molybdenum nitride, cobalt molybdenum nitride, palladium molybdenum nitride, platinum molybdenum nitride, manganese molybdenum nitride, titanium molybdenum nitride, molybdenum silicide chloride, aluminum molybdenum chloride, copper molybdenum chloride, tungsten molybdenum chloride, zirconium molybdenum chloride, hafnium molybdenum chloride, rhodium molybdenum chloride, vanadium molybdenum chloride, tantalum molybdenum chloride, nickel molybdenum chloride, chromium molybdenum chloride, cobalt molybdenum chloride, palladium molybdenum chloride, platinum molybdenum chloride, manganese molybdenum chloride, titanium molybdenum chloride, molybdenum silicide phosphide, aluminum molybdenum phosphide, copper molybdenum phosphide, tungsten molybdenum phosphide, zirconium molybdenum phosphide, hafnium molybdenum phosphide, rhodium molybdenum phosphide, vanadium molybdenum phosphide, tantalum molybdenum phosphide, nickel molybdenum phosphide, chromium molybdenum phosphide, cobalt molybdenum phosphide, palladium molybdenum phosphide, platinum molybdenum phosphide, manganese molybdenum phosphide or titanium molybdenum phosphide.

In the embodiment of the invention, the materials for forming the third source/drain protection layer 64 are same as the materials for forming the third gate protection layer 24. Similarly, the third source/drain protection layer 64 may be formed as a single layer structure formed by one of the above-mentioned materials for forming the third source/drain protection layer, or the third source/drain protection layer 64 may be formed as a laminated structure formed by two or more of the above-mentioned materials. The materials for forming the fourth source/drain protection layer 65 are same as the materials for forming the fourth gate protection layer 25. Similarly, the fourth source/drain protection layer 65 may be formed as a single layer structure formed by the above-mentioned materials for forming the fourth source/drain protection layer, or the fourth source/drain protection layer 65 may be formed as a laminated structure formed of two or more of the above-mentioned materials. The third source/drain protection layer 64 and the fourth source/drain protection layer 65 are used to prevent the diffusion of copper of the source and drain electrodes metal layer.

For example, the active layer 4 is made of metal oxide semiconductor, polysilicon or amorphous silicon.

In the embodiment of the invention, the improvement to the gate electrode and/or the source and drain electrodes can be applied not only to the metal-oxide-semiconductor thin-film transistor, but also to the polysilicon thin-film transistor or the amorphous-silicon thin-film transistor. In addition, the improvement to the gate electrode and/or the source and drain electrodes can be applied the array substrate comprising these thin-film transistors.

An embodiment of the invention further provides an array substrate, and the array substrate comprises the above-mentioned thin-film transistor. The array substrate comprises a base substrate 1, and a gate line layer, a gate insulating layer 3, an active layer 4 and the like provided on the base substrate 1. The thin-film transistor on the array substrate may be of either a top gate type or a bottom gate type. As an example, FIG. 1 illustrates the array substrate comprising the bottom-gate-type thin-film transistor. The array substrate comprises: the gate line layer (comprising a gate line and a gate electrode 2), formed on the base substrate 1; the gate insulating layer 3, formed on the gate line layer; the active layer 4, formed on the gate insulating layer 3; an etching barrier layer 5 (for preventing a damage on the active layer upon forming a data line layer), covering a portion of the active layer 4; the data line layer (comprising a data line and source and drain electrodes 6), formed on the active layer 4 and the etching barrier layer 5; a passivation layer 7, covering the entire base substrate and having a via hole above a portion of the source and drain electrodes 6; and a pixel electrode layer 8, formed on the passivation layer 7 and connected with the source and drain electrodes 6 by the via hole.

An embodiment of the invention further provides a display device, and the display device comprises the above-mentioned array substrates. The display device may be: liquid crystal display panel, e-paper, organic light emitting diode (OLED) panel, liquid crystal television, liquid crystal display, digital photo frame, mobile phone, tablet computer or any other products or components having display function.

An embodiment of the invention further provides a method for fabricating a thin-film transistor. The method comprises the following steps: forming a gate electrode on the base substrate, wherein the gate electrode comprising a gate electrode metal layer and a first protection layer sequentially formed on the base substrate, and the gate electrode metal layer is made of copper or copper alloy; forming a gate insulating layer covering the gate electrode and the base substrate on the base substrate on which the gate electrode has been formed; forming an active layer provided above the gate electrode on the base substrate on which the gate insulating layer has been formed, and forming an etching barrier layer on the active layer; and forming source and drain electrodes on the base substrate on which the etching barrier layer has been formed.

For example, the gate electrode comprises a second protection layer, the gate electrode metal layer and the first protection layer sequentially formed on the base substrate.

For example, the second protection layer comprises a first gate protection layer and a second gate protection layer sequentially formed on the base substrate; the first protection layer comprises a third gate protection layer and a fourth gate protection layer sequentially formed on the gate electrode metal layer.

For example, the source and drain electrodes comprise a second source/drain protection layer and a source and drain electrodes metal layer sequentially formed on the etching barrier layer.

For example, the source and drain electrodes further comprise a third protection layer formed on the source and drain electrodes metal layer, and the third protection layer comprises a third source/drain protection layer and a fourth source/drain protection layer sequentially formed on the source and drain electrodes metal layer.

The thin-film transistor fabricated by the above-mentioned method is a bottom-gate-type thin-film transistor. When the gate electrode is fabricated, the gate electrode metal layer and the first protection layer are fabricated sequentially, and the first protection layer comprise the third gate protection layer and the fourth gate protection layer formed sequentially. In addition, the second protection layer, the gate electrode metal layer and the first protection layer may be fabricated sequentially on the base substrate, wherein the second protection layer comprises the first gate protection layer and the second protection layer formed sequentially. When the source and drain electrodes is fabricated, the second source/drain protection layer and the source and drain electrodes metal layer are fabricated sequentially. In addition, the third protection layer may be fabricated on the source and drain electrodes metal layer, and the third protection layer comprises the third source/drain protection layer and the fourth source/drain protection layer fabricated sequentially. In the embodiment of the invention, the third gate protection layer and the fourth protection layer are formed between the gate electrode metal layer and the active layer, thereby the diffusion of copper from the gate electrode metal layer to the active layer can be prevented and the yield can be improved.

An embodiment of the invention further provides another method for fabricating a thin-film transistor. The method comprises the following steps: forming source and drain electrodes on a base substrate; forming an etching barrier layer on the base substrate on which the source and drain electrodes have been formed; forming an active layer provided above the source and drain electrodes on the base substrate on which the etching barrier layer has been formed; forming a gate insulating layer on the base substrate on which the active layer has been formed; and forming a gate electrode on the base substrate on which the gate insulating layer has been formed, wherein the gate electrode comprises a first protection layer and a gate electrode metal layer sequentially formed on the insulating layer, and the gate electrode metal layer is made of copper or copper alloy.

For example, the gate electrode comprises the first protection layer, the gate electrode metal layer and a second protection layer sequentially formed on the gate insulating layer.

For example, the first protection layer comprises a fourth gate protection layer and a third gate protection layer sequentially formed on the gate insulating layer; the second protection layer comprises a second gate protection layer and a first gate protection layer sequentially formed on the gate electrode metal layer.

For example, the source and drain electrodes comprise a source and drain electrodes metal layer and a second source/drain protection layer sequentially formed on the base substrate.

For example, the source and drain electrodes further comprise a third protection layer, the source and drain electrodes metal layer and the second source/drain protection layer sequentially formed on the base substrate, and the third protection layer comprises a fourth source/drain protection layer and a third source/drain protection layer sequentially formed on the base substrate.

The thin-film transistor fabricated by the above-mentioned method is a top-gate-type thin-film transistor. When the gate electrode is fabricated, the first protection layer and the gate electrode metal layer are fabricated sequentially, and the first protection layer comprises the fourth gate protection layer and the third gate protection layer sequentially formed. In addition, the first protection layer, the gate electrode metal layer and the second protection layer may be fabricated sequentially, and the second protection layer comprises the second gate protection layer and the first gate protection layer formed sequentially. When the source and drain electrodes are fabricated, the source and drain electrodes metal layer and the second source/drain protection layer are fabricated sequentially. In addition, the third protection layer, the source and drain electrodes metal layer and the second source/drain protection layer may be fabricated sequentially, and the third protection layer comprises the fourth source/drain protection layer and the third source/drain protection layer fabricated sequentially. In the embodiment of the invention, the third gate protection layer and the fourth protection layer are formed between the gate electrode metal layer and the active layer, thereby the diffusion of copper from the gate electrode metal layer to the active layer can be prevented and the yield can be improved.

For example, after the gate insulating layer is fabricated, the method further comprises: performing an annealing process on the gate insulating layer.

In the conventional technology, hydrogen groups, such as hydroxyl ($OH^-$), hydrogen ions ($H^+$) and absorbed hydrogen element, are unavoidably doped in the gate insulating layer during the process of fabricating the gate insulating layer. These hydrogen groups are prone to break and then diffuse into the active layer during the fabrication process of the thin-film transistor and the operation process of the thin-film transistor. The $OH^-$, $H_2O$, $H^+$ and other substances diffused into the active layer reduces the stability of the thin-film transistor, and in this case, the threshold voltage ($V_{th}$) of the thin-film transistor changes greatly and finally product failure occurs. By performing the annealing process after the formation of the gate insulating layer, the diffusion of the hydrogen groups can be prevented, and thus the occurrence of great change of threshold voltage can be avoided and the yield can be improved.

Hereinafter, the array substrate comprising the thin-film transistor and the method for fabricating the array substrate according to the embodiments of the invention will be explained in detail as an example. In this example, the thin-film transistor is of the bottom gate type, and the active layer is formed by the oxide semiconductor; however, the embodiment of the invention is clearly not limited thereto. Referring to FIG. 1-FIG. 4, the method for fabricating the array substrate according to the embodiment of the invention comprises steps as follows.

Step 1: a first gate protection layer 21 is formed on a base substrate.

The base substrate may be made of glass. The first gate protection layer may be made of silicon nitride or titanium nitride, or other inorganic insulating materials with material properties identical with or similar to the above-mentioned materials. The thickness of the first gate protection layer may be 10 nm-300 nm.

Step 2: after the first gate protection layer 21 is formed, a second gate protection layer 22 is formed on the first gate protection layer 21.

The second gate protection layer 22 is mainly made of alloy of Mo, Ti and Si, wherein the element Ti may be replaced by W, Zr, Nb, Cu, V, Ta, Ni, Cr, Hf, Rh, Co, Pd, Pt, Al, Mn. In addition, the second gate protection layer 22 may be made of other materials with material properties identical with or similar to the above-mentioned materials.

Step 3: after the second gate protection layer 22 is formed, a gate electrode metal layer 23 is formed on the second gate protection layer 22. The gate electrode metal layer 23 is made of copper or copper alloy.

Step 4: after the gate electrode metal layer 23 is formed, a third gate protection layer 24 is formed on the gate electrode metal layer 23.

The third gate protection layer 24 is made of alloy of Mo, Al and Nb, wherein Al may be replaced by W, Zr, V, Ta, Ni, Cr, Co, Pd, Pt, Hf, Rh, Mn, Ti, Si or other elements, and Nb may be replaced by W, Zr, V, Ta, Ni, Cr, Co, Pd, Pt, Hf, Rh, Mn, Ti, Si or other elements. Meanwhile, the above-mentioned two metal elements Al and Nb may be replaced by other metals with the identical or similar properties.

Step 5: after the third gate protection layer 24 is formed, a fourth gate protection layer 25 is formed on the third gate protection layer 24.

The fourth gate protection layer 25 is made of molybdenum silicide nitride (MoSiNx), wherein the element Si may be replaced by N, Al, Cu, W, Zr, Hf, Rh, V, Ta, Ni, Cr, Co, Pd, Pt, Mn, Ti or other elements, and the element N may be replaced by Cl, P or other elements with the identical or similar properties.

Step 6: a patterning process is performed to a gate electrode layer formed of the first gate protection layer 21, the second gate protection layer 22, the gate electrode metal layer 23, the third gate protection layer 24 and the fourth gate protection layer 25, to form a gate electrode 2. For example, in the patterning process, the gate electrode layer is patterned by a wet-etching method, a dry-etching method or a combination of the wet-etching method and the dry-etching method.

Step 7: after the gate electrode 2 is formed, a gate insulating layer 3 is formed to cover the gate electrode 2 and the base substrate 1.

The gate insulating layer 3 may be made of a silicon dioxide film, an aluminum oxide film, a titanium oxide film, a silicon oxynitride film, a zirconium oxide film, a tantalum oxide film, a barium titanate film, a neodymium oxide film, a silicon oxynitride film, an aluminum oxynitride film, a zirconium oxynitride film, tantalum oxynitride film, a neodymium oxynitride film, a silicon nitride film, an aluminum nitride film, a zirconium nitride film, or a tantalum nitride film. In addition, the gate insulating layer 3 may be made of other inorganic insulating material with the material properties identical with or similar to the above-mentioned materials. Meanwhile, the gate insulating layer in this embodiment may be formed as a single layer structure formed of one of the above-mentioned materials, or the gate insulating layer in this embodiment may be formed as a laminated structure formed of two, three or more of the above-mentioned materials, which all fall into the protection scope of the invention.

Step 8: an annealing process is performed on the gate insulating layer in the case that the gate insulating layer 3 is a single layer of nitride or oxynitride. For example, the annealing process is performed under the temperature of 250☐-500☐ for 10 min-200 min.

In the conventional technology, hydrogen groups, such as hydroxyl (OH⁻), hydrogen ions (H⁺) and absorbed hydrogen element, are unavoidably doped in the gate insulating layer during the process of fabricating the gate insulating layer. These hydrogen groups are prone to break and then diffuse into the active layer during the fabrication process of the thin-film transistor and the operation process of the thin-film transistor. The OH⁻, $H_2O$, H⁺ and other substances diffused into the active layer reduces the stability of the thin-film transistor, and in this case, the threshold voltage ($V_{th}$) of the thin-film transistor changes greatly and finally product failure occurs. By performing the annealing process after the formation of the gate insulating layer, the diffusion of the hydrogen groups can be prevented, and thus the occurrence of great change of threshold voltage can be avoided and the yield can be improved.

Step 9: after completion of the above-mentioned steps, an oxide active layer 4 is formed.

The active layer is made of metal oxide semiconductor, such as indium gallium zinc oxide (IGZO), indium gallium tin oxide (ITZO), indium zinc oxide (IZO), zinc tin oxide (TZO) or other metal oxide semiconductor with similar properties. An annealing process may be selectively performed on the oxide active layer 4. After this annealing process, the oxide active layer is patterned. The oxide active layer may be patterned by a wet-etching method, a dry-etching method or a combination of the wet-etching method and the dry-etching method. In addition, during the patterning process, an annealing process and a surface treatment process may be selectively performed.

Step 10: after the oxide active layer 4 is formed, an etching barrier layer 5 is formed on the oxide active layer 4.

The etching barrier layer 5 may be made of a silicon dioxide film, an aluminum oxide film, a titanium oxide film, a silicon oxynitride film, a zirconium oxide film, a tantalum oxide film, a barium titanate film, a neodymium oxide film, a silicon oxynitride film, an aluminum oxynitride film, a zirconium oxynitride film, tantalum oxynitride film, a neodymium oxynitride film. In addition, the etching barrier layer 5 may be formed of other inorganic insulating materials with the material properties identical with or similar to the above-mentioned materials.

Step 11: after the etching barrier layer 5 is formed, a second source/drain protection layer 62 is formed on the etching barrier layer 5.

The second source/drain protection layer 62 may be made of alloy of Mo, Ti and Si, wherein the element Ti may be replaced by W, Zr, Nb, Cu, V, Ta, Ni, Cr, Hf, Rh, Co, Pd, Pt, Al, Mn, or other elements with identical or similar properties.

Step 12: after the second source/drain protection layer 62 is formed, a source and drain electrodes metal layer 63 is formed on the second source/drain protection layer 62. The source and drain electrodes metal layer 63 is made of copper or copper alloy.

Step 13: after the source and drain electrodes metal layer 63 is formed, a third source/drain protection layer 64 is formed on the source and drain electrodes metal layer 63.

The third source/drain protection layer 64 is made of alloy of Mo, Al and Nb, wherein the element Al may be replaced by W, Zr, V, Ta, Ni, Cr, Co, Pd, Pt, Hf, Rh, Mn, Ti, Si or other elements, and the element Nb may be replaced by W, Zr, V, Ta, Ni, Cr, Co, Pd, Pt, Hf, Rh, Mn, Ti, Si or other elements. Meanwhile, the above two metal elements Al and Nb may be replaced by other metals with identical or similar properties.

Step 14: after the third source/drain protection layer 64 is formed, a fourth source/drain protection layer 65 is formed on the third source/drain protection layer 64.

The fourth source/drain protection layer 65 is made of molybdenum silicide nitride (MoSiNx), wherein the element Si may be replaced by N, Al, Cu, W, Zr, Hf, Rh, V, Ta, Ni, Cr, Co, Pd, Pt, Mn, Ti or other elements, and the element N may be replaced by Cl, P or other elements with identical or similar properties.

Step 15: after the second source/drain protection layer 62, the source and drain electrodes metal layer 63, the third source/drain protection layer 64 and the fourth source/drain protection layer 65 are formed, a patterning process is performed to form source and drain electrodes 6; after the source and drain electrodes 6 are formed, a passivation layer 7 is formed, and then a patterning process is performed on the passivation layer 7 to form a via hole.

The passivation layer 7 may be made of a silicon dioxide film, an aluminum oxide film, a titanium oxide film, a silicon oxynitride film, a zirconium oxide film, a tantalum oxide film, a barium titanate film, a neodymium oxide film, a silicon oxynitride film, an aluminum oxynitride film, a zirconium oxynitride film, a tantalum oxynitride film, a neodymium oxynitride film, a silicon nitride film, an aluminum nitride film, a zirconium nitride film or a tantalum nitride film. In addition, the passivation layer 7 may be formed of other inorganic insulating materials with the material properties identical with or similar to the above-mentioned materials. Meanwhile, the passivation layer may be formed as a single layer structure formed of one of the above-mentioned materials, or the passivation layer may be formed as a laminated structure formed of two or three or more of the above-mentioned materials. The passivation layer may comprise organic insulating materials. The organic insulating materials may be resin materials or acrylic-based materials.

Step 16: after the above-mentioned steps are completed, a pixel electrode 8 is formed.

In the embodiments of the invention, the protection layer of the gate electrode and the protection layer of the source and drain electrodes are provided, so that the yield can be improved even when the electrodes of the thin-film transistor are made of copper or copper alloy. Thereby, the yield can be effectively improved, the cost can be reduced, and the productivity can be increased.

The foregoing embodiments merely are exemplary embodiments of the invention, and not intended to define the scope of the invention, and the scope of the invention is determined by the appended claims.

What is claimed is:

1. A thin-film transistor, comprising a gate electrode, an active layer, source and drain electrodes, and a gate insulating layer provided between the gate electrode and the active layer, wherein:
   the gate electrode comprises:
      a gate electrode metal layer,
      a first protection layer, the first protection layer being provided between the gate electrode metal layer and the gate insulating layer to isolate the active layer from the gate electrode metal layer, and the first protection layer comprising a third gate protection layer and a fourth gate protection layer, at least one of the third gate protection layer and the fourth gate protection layer being a multi-layer structure; and
      a second protection layer, the second protection layer being provided on an side of the gate electrode metal layer opposite to the first protection layer, and the second protection layer comprising a first gate protection layer and a second gate protection layer, the second gate protection layer being a multi-layer structure and provided between the first gate protection layer and the gate electrode metal layer.

2. The thin-film transistor according to claim 1, wherein:
   the first gate protection layer is made of silicon nitride or titanium nitride; and/or
   the second gate protection layer is made of molybdenum titanium alloy, molybdenum tungsten alloy, molybdenum zirconium alloy, molybdenum niobium alloy, molybdenum copper alloy, molybdenum vanadium alloy, molybdenum tantalum alloy, molybdenum nickel alloy, molybdenum chromium alloy, molybdenum hafnium alloy, molybdenum rhodium alloy, molybdenum cobalt alloy, molybdenum palladium alloy, molybdenum platinum alloy, molybdenum aluminum alloy, molybdenum manganese alloy, titanium silicide, tungsten silicide, zirconium silicide, niobium silicide, copper silicide, vanadium silicide, tantalum silicide, nickel silicide, chromium silicide, hafnium silicide, rhodium silicide, cobalt silicide, palladium silicide, platinum silicide, aluminum silicide or manganese silicide.

3. The thin-film transistor according to claim 1, wherein:
   the first protection layer comprises a third gate protection layer and a fourth gate protection layer, the third gate protection layer is provided between the gate electrode metal layer and the fourth gate protection layer.

4. The thin-film transistor according to claim 3, wherein:
   the third gate protection layer is made of molybdenum aluminum niobium alloy, molybdenum tungsten alloy, molybdenum zirconium alloy, molybdenum vanadium alloy, molybdenum tantalum alloy, molybdenum nickel alloy, molybdenum chromium alloy, molybdenum cobalt alloy, molybdenum palladium alloy, molybdenum platinum alloy, molybdenum hafnium alloy, molybdenum rhodium alloy, molybdenum manganese alloy, molybdenum silicide or molybdenum titanium alloy; and/or
   the fourth gate protection layer is made of molybdenum nitride, molybdenum silicide nitride, aluminum molybdenum nitride, copper molybdenum nitride, tungsten molybdenum nitride, zirconium molybdenum nitride, hafnium molybdenum nitride, rhodium molybdenum nitride, vanadium molybdenum nitride, tantalum molybdenum nitride, nickel molybdenum nitride, chromium molybdenum nitride, cobalt molybdenum nitride, palladium molybdenum nitride, platinum molybdenum nitride, manganese molybdenum nitride, titanium molybdenum nitride, molybdenum silicide chloride, aluminum molybdenum chloride, copper molybdenum chloride, tungsten molybdenum chloride, zirconium molybdenum chloride, hafnium molybdenum chloride, rhodium molybdenum chloride, vanadium molybdenum chloride, tantalum molybdenum chloride, nickel molybdenum chloride, chromium molybdenum chloride, cobalt molybdenum chloride, palladium molybdenum chloride, platinum molybdenum chloride, manganese molybdenum chloride, titanium molybdenum chloride, molybdenum silicide phosphide, aluminum molybdenum phosphide, copper molybdenum phosphide, tungsten molybdenum phosphide, zirconium molybdenum phosphide, hafnium molybdenum phosphide, rhodium molybdenum phosphide, vanadium molybdenum phosphide, tantalum molybdenum phosphide, nickel molybdenum phosphide, chromium molybdenum phosphide, cobalt molybdenum phosphide, palladium molybdenum phosphide, platinum molybdenum phosphide, manganese molybdenum phosphide or titanium molybdenum phosphide.

5. The thin-film transistor according to claim 1, wherein:
   the first protection layer comprises a third gate protection layer and a fourth gate protection layer, the third gate protection layer is provided between the gate electrode metal layer and the fourth gate protection layer.

6. The thin-film transistor according to claim 5, wherein:
   the third gate protection layer is made of molybdenum aluminum niobium alloy, molybdenum tungsten alloy, molybdenum zirconium alloy, molybdenum vanadium alloy, molybdenum tantalum alloy, molybdenum nickel alloy, molybdenum chromium alloy, molybdenum cobalt alloy, molybdenum palladium alloy, molybdenum platinum alloy, molybdenum hafnium alloy, molybdenum rhodium alloy, molybdenum manganese alloy, molybdenum silicide or molybdenum titanium alloy; and/or
   the fourth gate protection layer is made of molybdenum nitride, molybdenum silicide nitride, aluminum molybdenum nitride, copper molybdenum nitride, tungsten molybdenum nitride, zirconium molybdenum nitride, hafnium molybdenum nitride, rhodium molybdenum nitride, vanadium molybdenum nitride, tantalum molybdenum nitride, nickel molybdenum nitride, chromium molybdenum nitride, cobalt molybdenum nitride, palladium molybdenum nitride, platinum molybdenum nitride, manganese molybdenum nitride, titanium molybdenum nitride, molybdenum silicide chloride, aluminum molybdenum chloride, copper molybdenum chloride, tungsten molybdenum chloride, zirconium molybdenum chloride, hafnium molybdenum chloride, rhodium molybdenum chloride, vanadium molybdenum chloride, tantalum molybdenum chloride, nickel molybdenum chloride, chromium molybdenum chloride, cobalt molybdenum chloride, palladium molybdenum chloride, platinum molybdenum chloride, manganese molybdenum chloride, titanium molybdenum chloride, molybdenum silicide phosphide, aluminum molybdenum phosphide, copper molybdenum phosphide, tungsten molybdenum phosphide, zirconium molybdenum phosphide, hafnium molybdenum phosphide, rhodium molybdenum phosphide, vanadium molybdenum phosphide, tantalum molybdenum phosphide, nickel molybdenum phosphide, chromium molybdenum phosphide, cobalt molybdenum phosphide, palladium molybdenum phosphide, platinum molybdenum phosphide, manganese molybdenum phosphide or titanium molybdenum phosphide.

7. The thin-film transistor according to claim 2, wherein:
the first protection layer comprises a third gate protection layer and a fourth gate protection layer, the third gate protection layer is provided between the gate electrode metal layer and the fourth gate protection layer.

8. The thin-film transistor according to claim 7, wherein:
the third gate protection layer is made of molybdenum aluminum niobium alloy, molybdenum tungsten alloy, molybdenum zirconium alloy, molybdenum vanadium alloy, molybdenum tantalum alloy, molybdenum nickel alloy, molybdenum chromium alloy, molybdenum cobalt alloy, molybdenum palladium alloy, molybdenum platinum alloy, molybdenum hafnium alloy, molybdenum rhodium alloy, molybdenum manganese alloy, molybdenum silicide or molybdenum titanium alloy; and/or
the fourth gate protection layer is made of molybdenum nitride, molybdenum silicide nitride, aluminum molybdenum nitride, copper molybdenum nitride, tungsten molybdenum nitride, zirconium molybdenum nitride, hafnium molybdenum nitride, rhodium molybdenum nitride, vanadium molybdenum nitride, tantalum molybdenum nitride, nickel molybdenum nitride, chromium molybdenum nitride, cobalt molybdenum nitride, palladium molybdenum nitride, platinum molybdenum nitride, manganese molybdenum nitride, titanium molybdenum nitride, molybdenum silicide chloride, aluminum molybdenum chloride, copper molybdenum chloride, tungsten molybdenum chloride, zirconium molybdenum chloride, hafnium molybdenum chloride, rhodium molybdenum chloride, vanadium molybdenum chloride, tantalum molybdenum chloride, nickel molybdenum chloride, chromium molybdenum chloride, cobalt molybdenum chloride, palladium molybdenum chloride, platinum molybdenum chloride, manganese molybdenum chloride, titanium molybdenum chloride, molybdenum silicide phosphide, aluminum molybdenum phosphide, copper molybdenum phosphide, tungsten molybdenum phosphide, zirconium molybdenum phosphide, hafnium molybdenum phosphide, rhodium molybdenum phosphide, vanadium molybdenum phosphide, tantalum molybdenum phosphide, nickel molybdenum phosphide, chromium molybdenum phosphide, cobalt molybdenum phosphide, palladium molybdenum phosphide, platinum molybdenum phosphide, manganese molybdenum phosphide or titanium molybdenum phosphide.

9. The thin-film transistor according to claim 1, wherein:
the source and drain electrodes of the thin-film transistor comprises a source and drain electrodes metal layer and a second source/drain protection layer, the second source/drain protection layer is provided between the source and drain electrodes metal layer and the active layer to isolate the source and drain electrodes metal layer from the active layer; and
the source and drain electrodes metal layer is made of copper or copper alloy.

10. The thin-film transistor according to claim 9, wherein:
the second source/drain protection layer is made of molybdenum titanium alloy, molybdenum tungsten alloy, molybdenum zirconium alloy, molybdenum niobium alloy, molybdenum copper alloy, molybdenum vanadium alloy, molybdenum tantalum alloy, molybdenum nickel alloy, molybdenum chromium alloy, molybdenum hafnium alloy, molybdenum rhodium alloy, molybdenum cobalt alloy, molybdenum palladium alloy, molybdenum platinum alloy, molybdenum aluminum alloy, molybdenum manganese alloy, titanium silicide, tungsten silicide, zirconium silicide, niobium silicide, copper silicide, vanadium silicide, tantalum silicide, nickel silicide, chromium silicide, hafnium silicide, rhodium silicide, cobalt silicide, palladium silicide, platinum silicide, aluminum silicide or manganese silicide.

11. The thin-film transistor according to claim 9, wherein:
the source and drain electrodes further comprises a third protection layer, the third protection layer is provided on an side of the source/drain metal layer opposite to the second source/drain protection layer; and
the third protection layer comprises a third source/drain protection layer and a fourth source/drain protection layer, and the third source/drain protection layer is provided between the source and drain electrodes metal layer and the fourth source/drain protection layer.

12. The thin-film transistor according to claim 11, wherein:
the third source/drain protection layer is made of molybdenum aluminum niobium alloy, molybdenum tungsten alloy, molybdenum zirconium alloy, molybdenum vanadium alloy, molybdenum tantalum alloy, molybdenum nickel alloy, molybdenum chromium alloy, molybdenum cobalt alloy, molybdenum palladium alloy, molybdenum platinum alloy, molybdenum hafnium alloy, molybdenum rhodium alloy, molybdenum manganese alloy, molybdenum silicide or molybdenum titanium alloy; and/or
the fourth source/drain protection layer is made of molybdenum nitride, molybdenum silicide nitride, aluminum molybdenum nitride, copper molybdenum nitride, tungsten molybdenum nitride, zirconium molybdenum nitride, hafnium molybdenum nitride, rhodium molybdenum nitride, vanadium molybdenum nitride, tantalum molybdenum nitride, nickel molybdenum nitride, chromium molybdenum nitride, cobalt molybdenum nitride, palladium molybdenum nitride, platinum molybdenum nitride, manganese molybdenum nitride, titanium molybdenum nitride, molybdenum silicide chloride, aluminum molybdenum chloride, copper molybdenum chloride, tungsten molybdenum chloride, zirconium molybdenum chloride, hafnium molybdenum chloride, rhodium molybdenum chloride, vanadium molybdenum chloride, tantalum molybdenum chloride, nickel molybdenum chloride, chromium molybdenum chloride, cobalt molybdenum chloride, palladium molybdenum chloride, platinum molybdenum chloride, manganese molybdenum chloride, titanium molybdenum chloride, molybdenum silicide phosphide, aluminum molybdenum phosphide, copper molybdenum phosphide, tungsten molybdenum phosphide, zirconium molybdenum phosphide, hafnium molybdenum phosphide, rhodium molybdenum phosphide, vanadium molybdenum phosphide, tantalum molybdenum phosphide, nickel molybdenum phosphide, chromium molybdenum phosphide, cobalt molybdenum phosphide, palladium molybdenum phosphide, platinum molybdenum phosphide, manganese molybdenum phosphide or titanium molybdenum phosphide.

13. The thin-film transistor according to claim 1, wherein the thin-film transistor is a bottom-gate-type thin-film transistor or a top-gate-type thin-film transistor.

14. The thin-film transistor according to claim 1, wherein the active layer is made of metal oxide semiconductor, polysilicon or amorphous silicon.

15. The thin-film transistor according to claim 1, wherein the gate electrode metal layer is made of copper or copper alloy.

16. An array substrate, comprising a thin-film transistor according to claim 1.

17. A display device, comprising an array substrate according to claim 16.

* * * * *